US007578628B2

(12) United States Patent
Sherman et al.

(10) Patent No.: US 7,578,628 B2
(45) Date of Patent: Aug. 25, 2009

(54) PORTABLE ELECTRONIC DEVICE INCLUDING COUPLING MEMBER WITH ELECTRICAL SUPPLY CONTACTS

(75) Inventors: Richard Sherman, Cedar Rapids, IA (US); Xiaonong Qian, Everett, WA (US)

(73) Assignee: Intermec IP Corp., Everett, WA (US)

( * ) Notice: Subject to any disclaimer, the term of this patent is extended or adjusted under 35 U.S.C. 154(b) by 341 days.

(21) Appl. No.: 11/420,685

(22) Filed: May 26, 2006

(65) Prior Publication Data

US 2006/0272725 A1 Dec. 7, 2006

Related U.S. Application Data

(60) Provisional application No. 60/685,438, filed on May 27, 2005.

(51) Int. Cl.
*B41J 3/36* (2006.01)
*H05K 5/00* (2006.01)

(52) U.S. Cl. .................................... 400/88; 361/679.01

(58) Field of Classification Search ................. 361/679, 361/681, 683; 138/99; 400/82, 88
See application file for complete search history.

(56) References Cited

U.S. PATENT DOCUMENTS 4,734,710 A * 3/1988 Sato et al. ................... 400/103
5,047,615 A * 9/1991 Fukumoto et al. ........... 235/432
5,057,676 A * 10/1991 Komaki ...................... 361/683
5,267,800 A * 12/1993 Petteruti et al. ............... 400/88
5,535,010 A * 7/1996 Izumi et al. ................. 358/296
5,718,526 A * 2/1998 Yokota ....................... 400/605
5,949,565 A * 9/1999 Ishida ........................ 398/131
6,088,049 A 7/2000 Austin et al. ................ 347/222
6,261,013 B1 * 7/2001 Bryer et al. ................. 400/613
6,270,271 B1 * 8/2001 Fujiwara ...................... 400/88
6,512,670 B1 * 1/2003 Boehme et al. ............. 361/681
6,607,316 B1 * 8/2003 Petteruti et al. ............... 400/82
6,652,170 B1 11/2003 Arnold ........................ 400/88
6,752,554 B1 * 6/2004 Brittingham ................. 400/88
6,899,477 B2 * 5/2005 Petteruti et al. ............... 400/82
6,916,128 B1 * 7/2005 Petteruti et al. ............... 400/88
7,033,097 B2 4/2006 Petteruti et al. ............. 400/693
7,399,129 B2 * 7/2008 Writt ........................... 400/88
2004/0018035 A1 * 1/2004 Petteruti et al. ............... 400/88
2006/0018102 A1 * 1/2006 Soderlund ................... 361/752

* cited by examiner

*Primary Examiner*—Jayprakash N Gandhi
*Assistant Examiner*—Adrian S Wilson
(74) *Attorney, Agent, or Firm*—Seed IP Law Group PLLC

(57) ABSTRACT

A portable electronic device having a first housing member, a second housing member, and a coupling member. Elements of the coupling member provide respective electrical paths from an exterior of the first housing member to an interior of the first housing member.

19 Claims, 8 Drawing Sheets

PORTABLE ELECTRONIC DEVICE INCLUDING COUPLING MEMBER WITH ELECTRICAL SUPPLY CONTACTS

CROSS-REFERENCE TO RELATED APPLICATION

This application claims the benefit under 35 U.S.C. § 119 (e) of U.S. Provisional Patent Application No. 60/685,438, filed May 27, 2005.

BACKGROUND OF THE INVENTION

1. Field of the Invention

The present disclosure is directed to portable electronic devices, such as handheld printers.

2. Description of the Related Art

Some portable electronic devices employ externally accessible contacts to supply power to the electronic device, for example to supply current to a rechargeable battery housed within. These externally accessible contacts are usually separate components serving the sole function of supplying electric current to the rechargeable battery. Having numerous sole-function components, however, adds to the cost and complexity of portable electronic devices.

For example, U.S. Pat. No. 6,652,170 issued to Gregory B. Arnold on Nov. 25, 2003, describes a portable printer including lower and upper housing sections. The portable printer of the '170 patent includes a printed circuit board having battery contacts that releasably contact four rechargeable batteries. The lower housing section includes a compartment for receiving a battery that is connected to the printed circuit board for powering the printer and its electronics. A separate port provides access from outside of the housing, to the printed circuit board.

U.S. Pat. No. 7,033,097, issued to Petteruti et al. on Apr. 25, 2006, describes a portable printer that includes a housing with upper and lower housing sections and a cover. The cover is coupled to the lower housing section by a hinge that enables the cover to pivot between an opened position and a closed position.

The present disclosure is directed to overcome one or more of the shortcomings set forth above.

BRIEF SUMMARY OF THE INVENTION

In one aspect, the present disclosure is directed to a portable electronic device including a first housing member, a second housing member, and a coupling member. The first housing member includes an interior and an exterior. The coupling member may physically couple the second housing member to the first housing member for pivotal movement about a first axis, between opened and closed positions. In the opened position, the interior of the first housing member may be accessible from the exterior of the housing. In the closed position, there may be limited access to the interior of the housing.

The coupling member may include at least a first coupling element and a second coupling element. At least a portion of each of the first and the second coupling elements may be accessible from the exterior of the first housing member. Each of the first and the second coupling elements may also provide at least a portion of respective electrical paths from the exterior of the first housing member, to the interior of the first housing member.

In another aspect, the present disclosure is directed to a portable electronic system including a housing. The housing may include a first housing member, a second housing member, and at least one coupling member. The coupling member may physically couple the second housing member to the first housing member for movement between an opened position and a closed position.

In the opened position, an interior of the housing, formed by the first and the second housing members, may be accessible from the exterior of the housing. In the closed position, there may be limited access to the interior of the housing, from the exterior of the housing.

The at least one coupling member may include at least a first coupling element and a second coupling element. At least a portion of each of the first and the second coupling elements may be accessible from the exterior of the housing. Each of the first and the second coupling elements may also form at least a portion of respective electrical paths from the exterior of the housing, to the interior of the housing.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

Figure 1A:
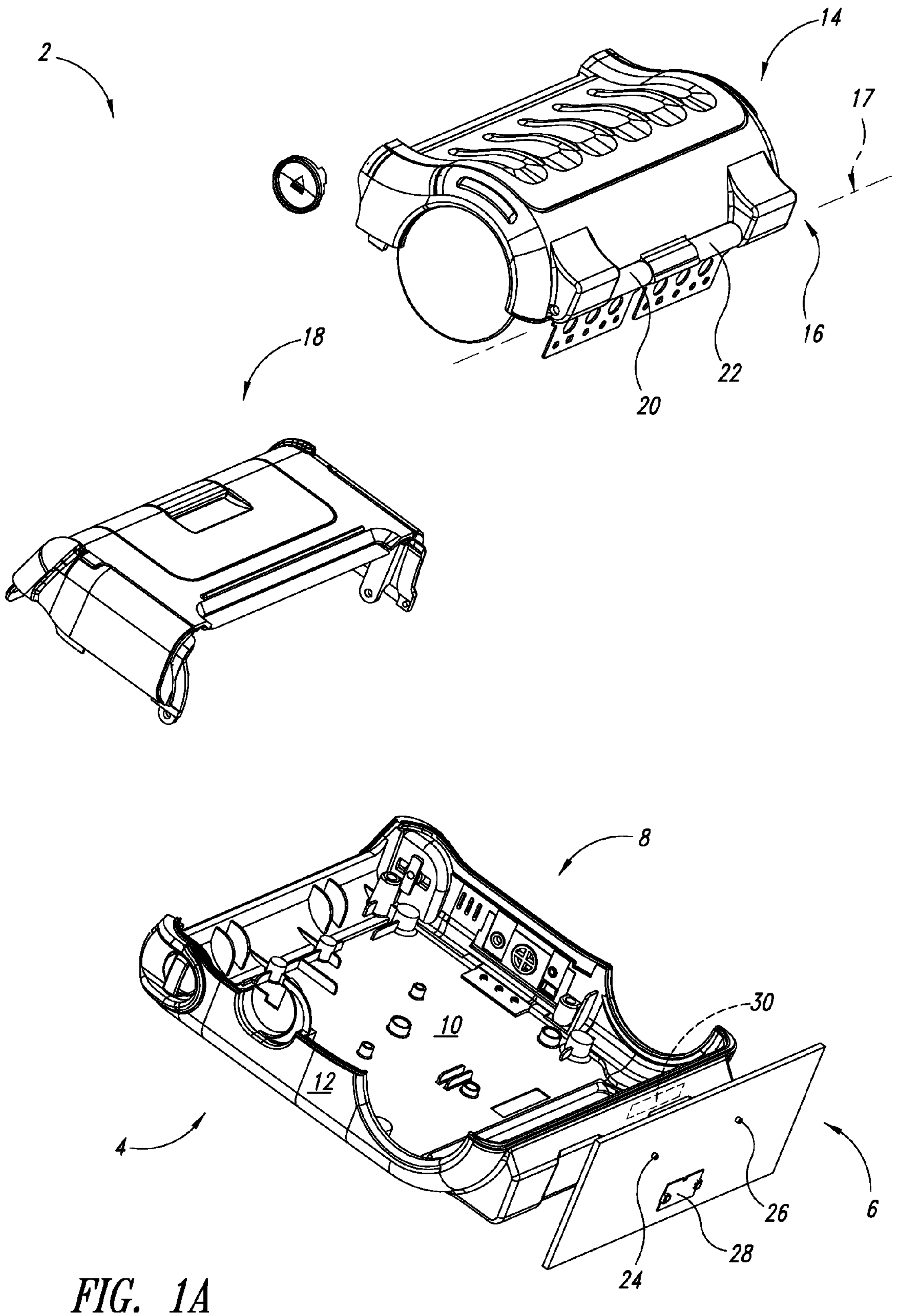
FIG. 1A is an exploded view of a portable electronic system, in the form of a handheld printer and power supply system, according to one illustrated embodiment.

In the following description, certain specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with portable electronic devices and external power supply systems such as internal electric wiring, print heads, transmitters, receivers, transceivers, integrators, scanners, imagers, processors, controller, rectifiers, electronic circuitry, and the like have not been shown or described in detail to avoid unnecessarily obscuring descriptions of the embodiments.

Unless the context requires otherwise, throughout the specification and claims which follow, the word “comprise” and variations thereof, such as, “comprises” and “comprising” are to be construed in an open, inclusive sense, that is as “including, but not limited to.”

Reference throughout this specification to “one embodiment,” or “an embodiment,” or “another embodiment” means that a particular referent feature, structure, or characteristic described in connection with the embodiment is included in at least one embodiment. Thus, the appearances of the phrases “in one embodiment,” or “in an embodiment,” or “another embodiment” in various places throughout this specification are not necessarily all referring to the same embodiment. Further more, the particular features, structures, or characteristics may be combined in any suitable manner in one or more embodiments.

It should be noted that, as used in this specification and the appended claims, the singular forms “a,” “an,” and “the” include plural referents unless the content clearly dictates otherwise. Thus, for example, reference to a portable electronic device including “a battery” includes a single battery, or two or more batteries. It should also be noted that the term “or” is generally employed in its sense including “and/or” unless the content clearly dictates otherwise.

The headings provided herein are for convenience only and do not interpret the scope or meaning of the embodiments.

FIGS. 1A through 1D show an exemplary electronic system 2 including a portable electronic device 4 and an external power supply unit 6.

The portable electronic device 4 may include a housing 7 including a first housing member 8 having an interior 10 and an exterior 12, a second housing member 14, and at least one coupling member 16. The portable electronic device 4 may further include a third housing member 18. In an embodiment, the at least one coupling member 16 may include hinges, slides, and the like.

Figure 1B:
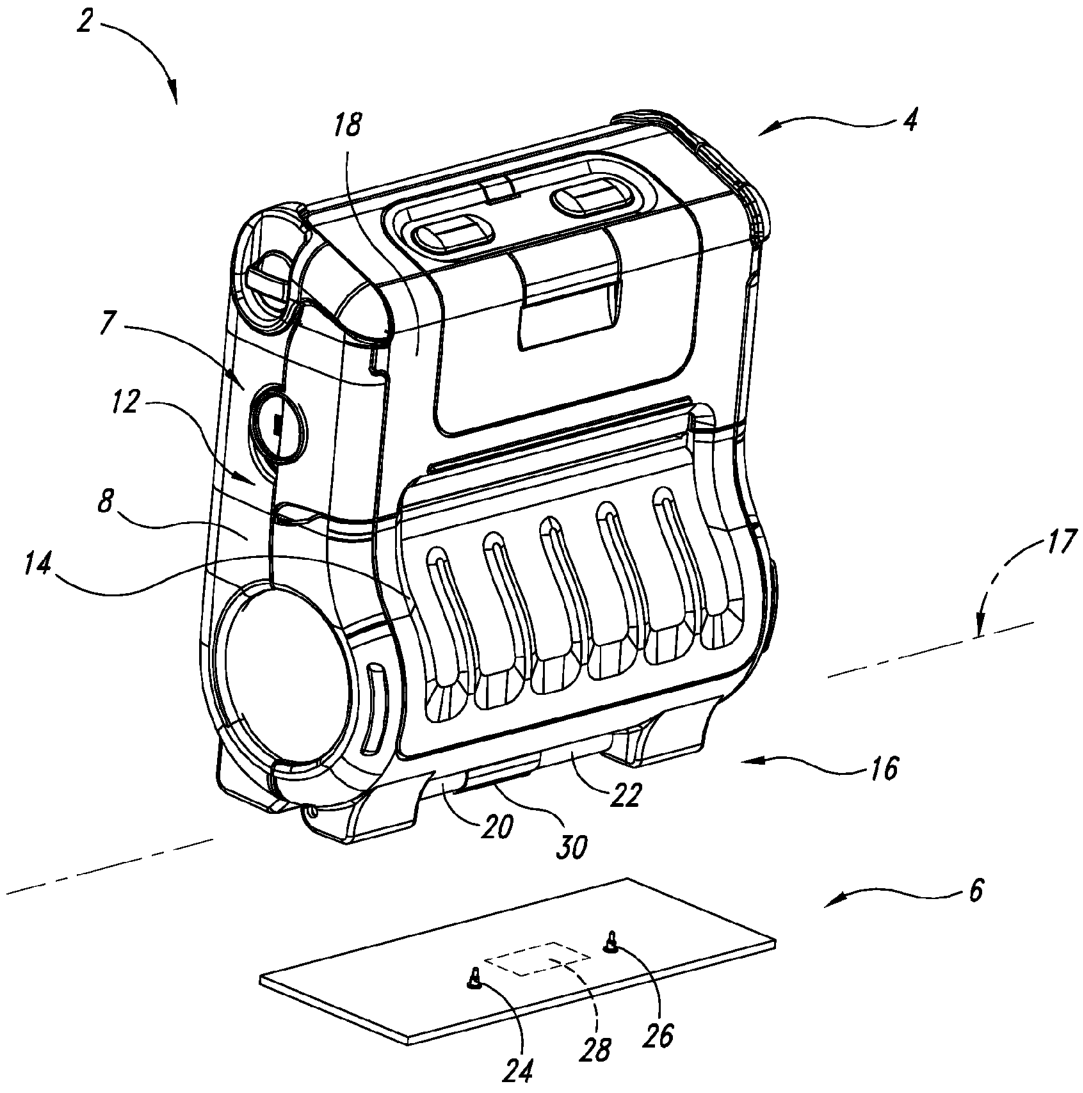
FIG. 1B is a front, top isometric view of a portable electronic system, in the form of a handheld printer and power supply system, according to another illustrated embodiment.
Figure 1C:
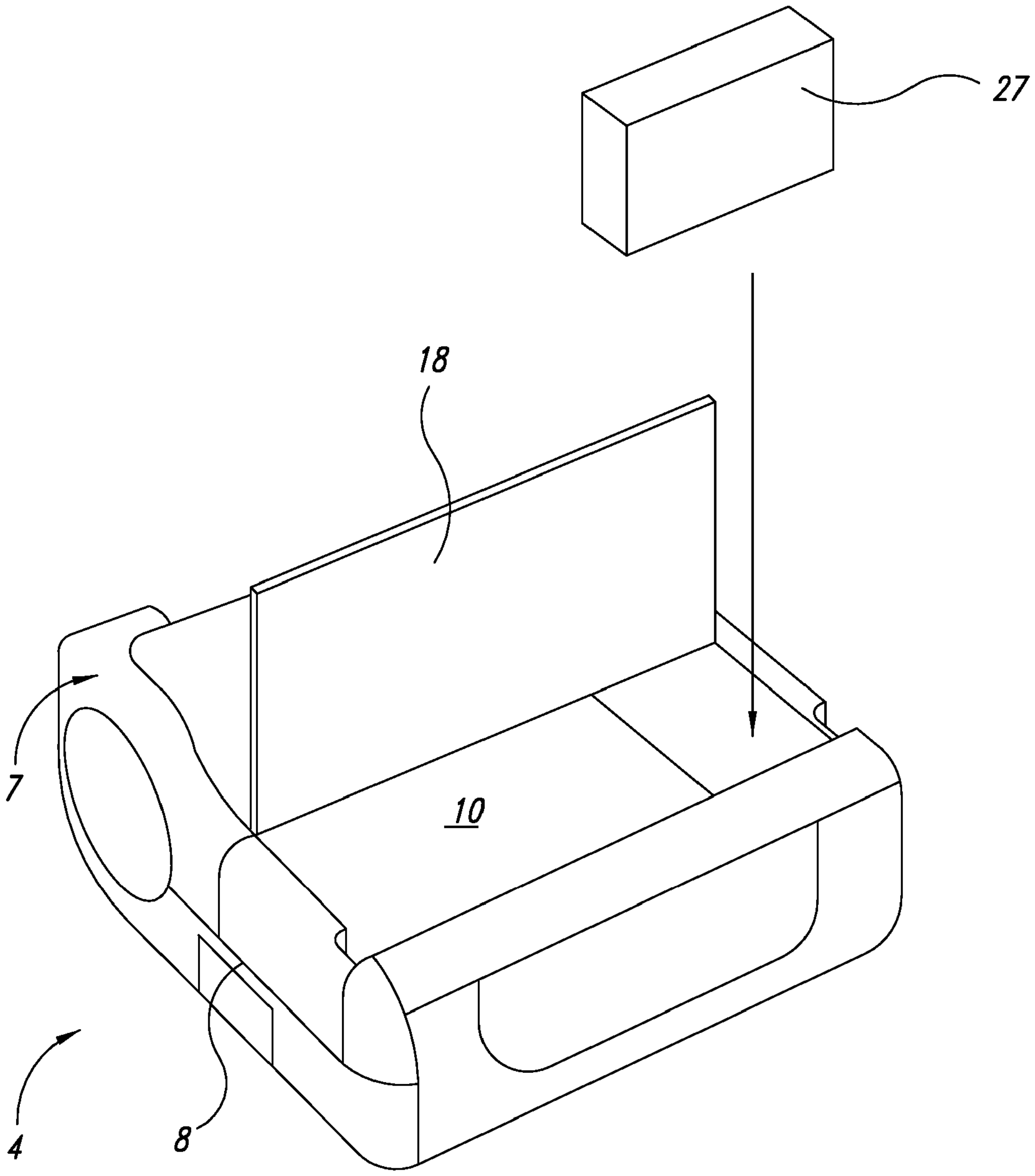
FIGS. 1C and 1D are top, front isometric views of a portable electronic device, in the form of a handheld printer, according to another illustrated embodiment.
Figure 1D:
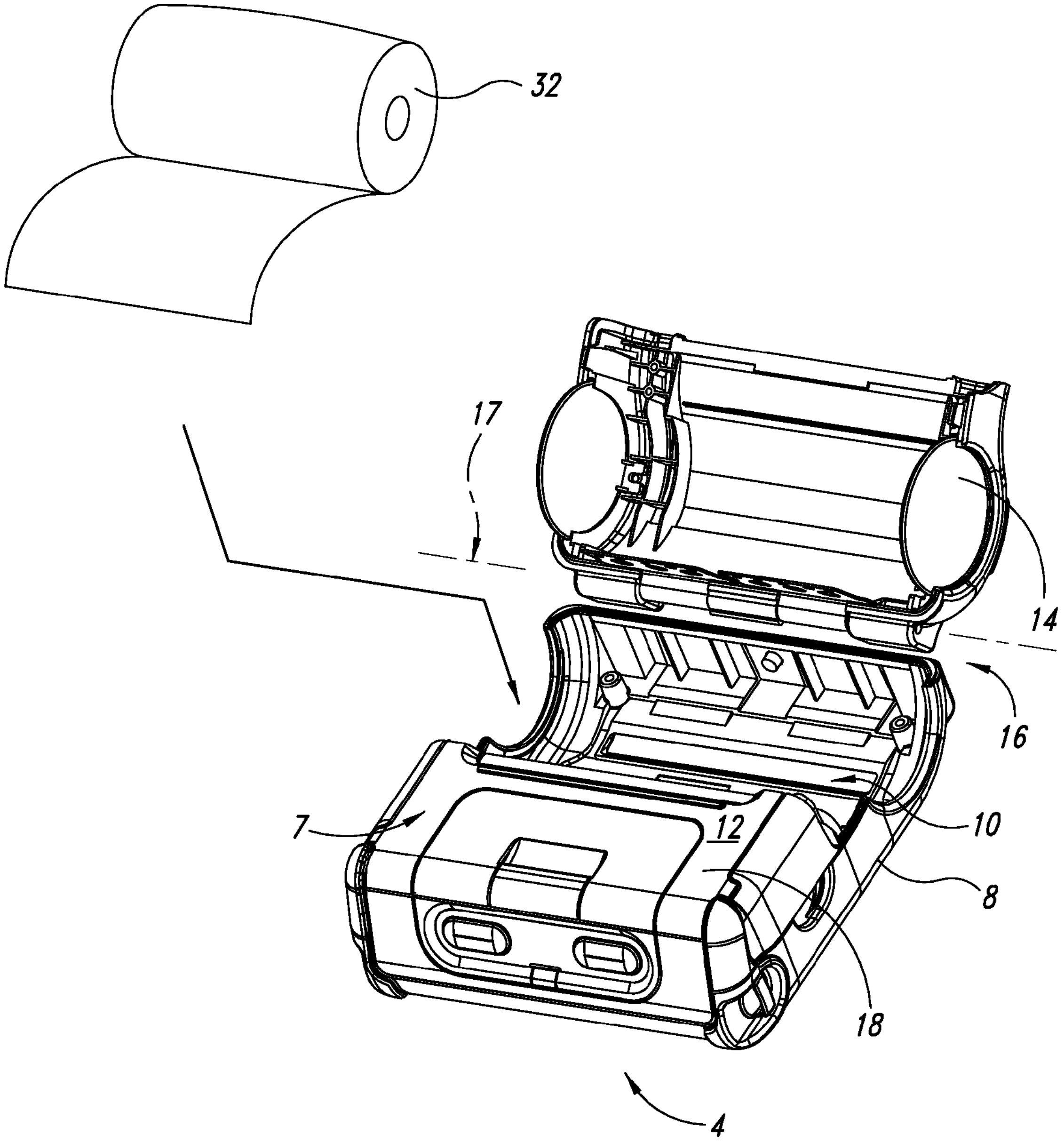
Figure 2A:
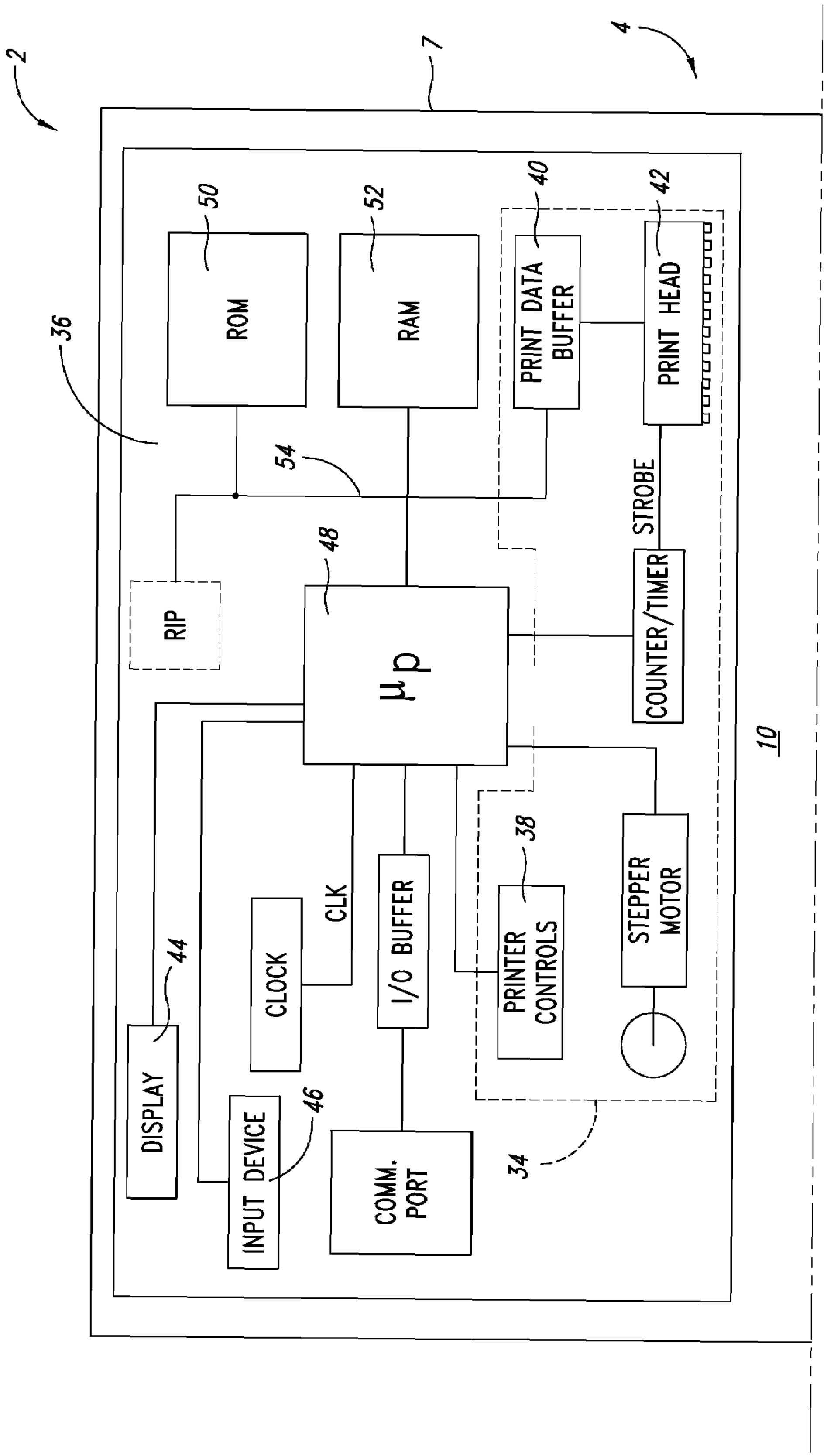
FIGS. 2A and 2B are functional block diagrams of a portable electronic system, in the form of a handheld printer and power supply system, according to another illustrated embodiment.
Figure 2B:
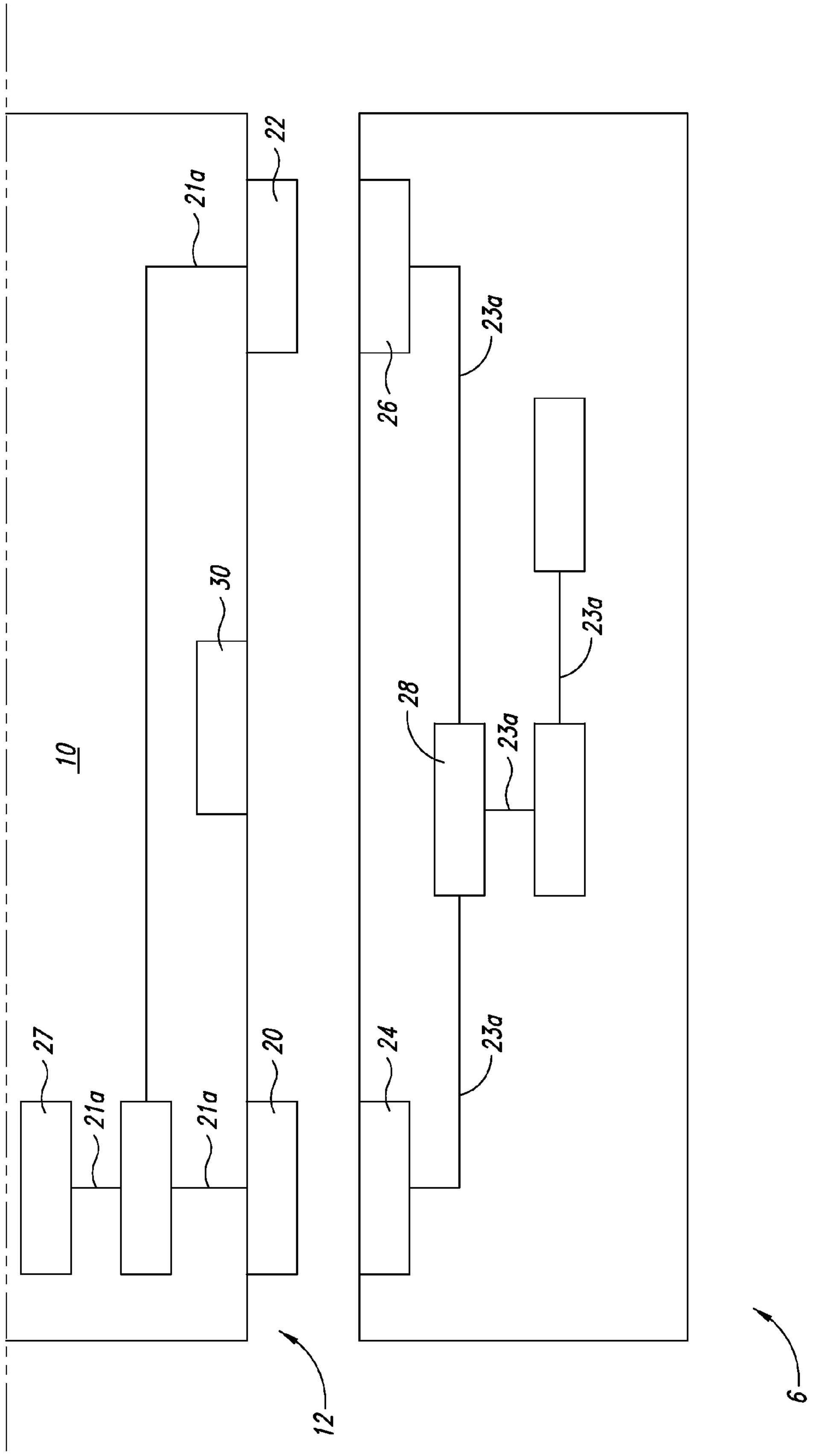

The first housing member 8 may be physically coupled to the second housing member 14 by the at least one coupling member 16 for movement, between an opened position (as shown in FIG. 1D) and a closed position (as shown in FIG. 1B). In one embodiment the movement may be a pivotal movement about a first axis 17. In the opened position, the interior 10 of the first housing member 8 is accessible from the exterior 12. In the closed position, access to the interior 10 of the first housing member 8 may be limited. In an embodiment, the portable electronic device 4 may include a housing 7 having an interior 10 and exterior 12. In the opened position (as shown in FIG. 1D), an interior 10 of the housing 7 may be accessible from the exterior 12 of the housing 7. In the closed position (as shown in FIG. 1B), there may be limited access to the interior 10 of the housing 7 from the exterior 12.

The coupling member 16 may include at least a first coupling element 20 and a second coupling element 22. At least a portion of each of the first and the second coupling elements 20, 22 may be accessible from the exterior 12 of the first housing member 8. In an embodiment, the coupling member 16 may be in the form of at least one hinge, physically coupling the second housing member 14 to the first housing member 8, for pivotal movement about the first axis 17 between the opened position (as shown in FIG. 1D) that provides access to the interior 10 of the first housing member 8 from the exterior 12, and the closed position (as shown in FIG. 1B) that limits access to the interior 10 of the first housing member 8 from the exterior 12. In another embodiment, the first and second coupling elements 20, 22 take the form of a first hinge element and a second hinge element respectively. At least a portion of each of the first and the second hinge elements may be accessible from the exterior 12 of the first housing member 8; and each of the first and the second hinge elements form at least a portion of the electrical path from the exterior 12 of the first housing member 8 to the interior 10 of the first housing member 8.

A portion of each of the first and the second coupling elements 20, 22 may include one or more electrically divided portions that provide a distinct electrical path between the interior 10 of the first housing member 8, and the exterior 12 of the first housing member 8. In an embodiment, the second coupling elements 20, 22 may include one or more electrically divided portions that provide a distinct electrical path from the interior 10 of the first housing member 8, to the exterior 12 of the first housing member 8, and to an external power supply unit 6. The electrically divided portions may comprise one or more electrically conductive materials. In an embodiment, the electrically conductive materials may include at least one metal. In another embodiment, the first and the second coupling elements 20, 22 may take the form of a first hinge element and a second hinge element, respectively.

The external power supply unit 6 may include at least two electrical contacts 24, 26, for selectively electrically coupling to respective portions of each of the first and the second coupling elements 20, 22 of the coupling member 16. The external supply unit 6 may be adapted to physically receive and support the portable electronic device 4, and may supply power to the interior 10. In an embodiment, the external supply unit 6 may supply power to an electrical storage device 27 received in the interior 10 of the first housing member 8. In another embodiment, the external power supply unit 6 may take the form of a power supply system, a power supply dock, a charging dock, a charging station, and the like. In another embodiment, the external power supply unit 6 may be shaped to receive one or more portable electronic devices 4. In an embodiment, the electrical storage device 27 is at least one rechargeable power supply, for example, at least one rechargeable battery.

Current flow, from the external power supply unit 6 to the interior 10 of the first housing member 8, via the at least two electrical charging contacts 24, 26, may be controlled by using one or more switches 28. For example, the portable electronic system 2 may include a switch 28 selectively operable to control the supply of current to the interior 10 of the first housing member 8, via at least one of the at least two electrical contacts 24, 26. The switch 28 may be responsive to a position of the portable electronic device 4, with respect to the external power supply unit 6. In an embodiment, the switch 28 may be in a closed state, allowing a current to flow from at least one of the electrical contacts 24, 26 of the external power supply unit 6, when the portable electronic device 4 is proximate to the external power supply unit 6. The switch 28 may be in an opened state, preventing current from flowing through any of the electrical contacts 24, 26, when the portable electronic device 4 is not proximate to the external power supply unit 6.

The portable electronic system 2 may further include a magnet 30 for actuating the switch 28 responsive to a position of the portable electronic device 4 with respect to the external power supply unit 6. In an embodiment, the switch 28 is a Reed switch carried by the external power supply 6. The Reed switch may be in a closed state, allowing a supply current to flow from at least one of the electrical contacts 24, 26 of the external power supply unit 6, when the magnet 30 of the portable electronic device 4 is proximate to the switch 28 of the external power supply unit 6; and may be in an opened state, not allowing a supply of current to flow from any of the electrical contacts 24, 26, when the magnet 30 of the portable electronic system 2 is not proximate to the switch 28 of the external power supply unit 6.

Referring to FIG. 1C, the portable electronic device 4 may include an electrical storage device 27 selectively receivable in the interior 10 of the first housing member 8.

Referring to FIGS. 1B and 1D, the electronic device 4, may take the form of a printer and may further include print media 32 selectively receivable in the interior 10 of the first housing member 8, when the second housing member 14 is in the opened position.

Referring to FIGS. 1A, 1B, 2A and 2B, the portable electronic system 2, in the form of a portable printer and a power supply system, may include a portable electronic device 4, and an external power supply unit 6. The portable electronic device 4 may include a housing 7, a print mechanism 34, and a control system 36.

The housing 7 may include at least a first coupling element 20 and a second coupling element 22. At least a portion of each of the first and the second coupling elements 20, 22 may be accessible from the exterior 12 of the housing 7. Each of the first and the second coupling elements 20, 22 may form at least a portion of respective electrical paths 21*a* from the exterior 12 of the housing 7 to the interior 10 of the housing 7. The first and the second coupling elements 20, 22 may be selectively electrically engageable by an external power source 6, and may provide respective electrical paths 21*a* providing electrical access from the exterior 12 to the interior 10 of the housing 7, or vice versa. Once electrically engaged, the external power supply unit 6 may supply power to the interior 10 of the housing 7 via the respective electrical paths 21*a*. In an embodiment, the coupling member 16 may include two or more electrically divided portions that provide distinct electrical paths 21*a* between the interior 10 of the housing 7 and the exterior 12. In another embodiment, the electrically divided portions may comprise one or more electrically conductive materials. In another embodiment, the electrically conductive materials may include at least one metal.

The print mechanism 34 may include a set of printer controls 38, a print data buffer 40, and a print head 42. The set of printer controls 38 may take the form of a set of switches on the portable electronic device 4 accessible by a user, and may allow a user to set a number of printer parameters. The printer controls 38 may take the form of user-selectable icons in a graphical user interface ("GUI") on a display 44 of the portable electronic system 2. The printer may also have user input device such as a keyboard, keypad, or touch sensitive screen 46. The print mechanism 34 received in the interior 10 of the housing 7 and electrically coupled to respective electrical paths 21*a* of the corresponding first and second coupling elements 20, 22. Examples of suitable print heads include laser print heads, impact print heads, inkjet print heads, thermal print head, and the like The control system 36 may include one or more controllers such as a microprocessor 48, a digital signal processor (DSP) (not shown), an application-specific integrated circuit (ASIC) (not shown), and the like. The control system 36 may include one or more memories, for example, read-only memory (ROM) 50, random access memory (RAM) 52, and the like coupled to the controllers by one or more busses 54. The portable electronic device 4 may take a handheld form and power may be supplied from the electrical storage device 27. The RAM 52 may take the form of volatile memory such as dynamic RAM. The RAM 52 should contain sufficient memory to store at least a portion of the instruction set for controlling a printer. A portion of the RAM 52 may form the print data buffer 40. Alternatively, the print data buffer 40 may be formed separately from the RAM 52. The print data buffer 40 should be sufficiently large to buffer print data to a print head 42.

The portable electronic device 4 may include an electrical storage device 27 received in the interior 10 of the first housing member 8 and electrically coupled to respective electrical paths 21*a*. In an embodiment, the electrical storage device 27 is at least one rechargeable power supply. In another embodiment, the electrical storage device 27 is at least one rechargeable battery.

The portable electronic system 2 may include an external power supply unit 6 having at least two electrical contacts 24, 26 for selectively electrically coupling to respective portions of each of the first and the second coupling elements 20, 22. The at least two electrical contacts 24, 26 may further be electrically coupled to and external power source via respective electrical paths 23*a*. Once electrically coupled, the external power supply unit 6 may supply power to the interior 10 of the housing 7 via the respective electrical paths 23*a* and 21*a*. In an embodiment, the external power source electrically coupled via the respective electrical paths 23*a* may include one or more electrical storage device.

The external supply unit 6 may be adapted to receive the portable electronic device 4, and may supply power to an electrical storage device 27 received in the interior 10 of the housing 7. In an embodiment, the external power supply unit 6 may include a power supply system, a power supply dock, a charging dock, a charging station, and the like. In another embodiment, the external power supply unit 6 may be shaped to receive the portable electronic device 10. In another embodiment, the housing 7 may be shaped to mate with a power supply dock and provide a secure connection between the coupling member 16 and the external power supply unit 6. In another embodiment, the housing 7 may be shaped to mate with a power supply station and provide a secure connection between the first and the second coupling elements 20, 22 of the portable electronic device 4, and the at least two electrical contacts 24, 26 of the external power supply unit 6.

A current flow, from the external power supply unit 6 to the interior 10 of the housing 7, via the respective electrical paths 21*a* and 23*a* provided by each of the first and the second coupling elements 20, 22 and respective at least two electrical charging contacts 24, 26, may be controlled by using one or more electric switches 28. For example, the portable electronic system 2 may include a switch 28 selectively operable to control the supply of current to the interior 10 of the housing 7 via at least one of the respective electrical paths 23*a* and at least one of the at least two electrical charging contacts 24, 26. The switch 28 may be responsive to a position of the housing 7 with respect to the external power supply unit 6. In an embodiment, the switch 28 may be in a closed state, allowing a current to flow from at least one of the electrical charging contacts 24, 26 of an external power source 34, when the housing 7 is proximate to the external power supply unit 6. The switch 28 may be in an opened state, preventing current from flowing through any of the electrical charging contacts 24, 26, when the housing 7 is not proximate to the external power supply unit 6.

In another embodiment, the portable electronic system 2 includes a portable electronic device 4; an external power supply unit 6 having a power supply dock; a switch 28 that is a Reed switch and is carried by the external power supply unit 6; and a housing 7 including a magnet 30. In a closed state, when the portable electronic device 4 is docked at the charging dock, and the magnet 30 is proximate to the switch 28, the magnet 30 may activate the Reed switch allowing a supply of current to flow from the external power supply unit 6, through at least one of the electrical charging contacts 24, 26 of the external power supply unit 6, and through the respective electrical paths 21*a* of each of the first and the second coupling elements 20, 22. In an opened state, when the portable electronic device 4 is not docked at the power supply dock, and the magnet 30 is not proximate to the switch 28, the Reed switch may not allow a current to flow through any of the electrical charging contacts 24, 26.

Figure 3A:
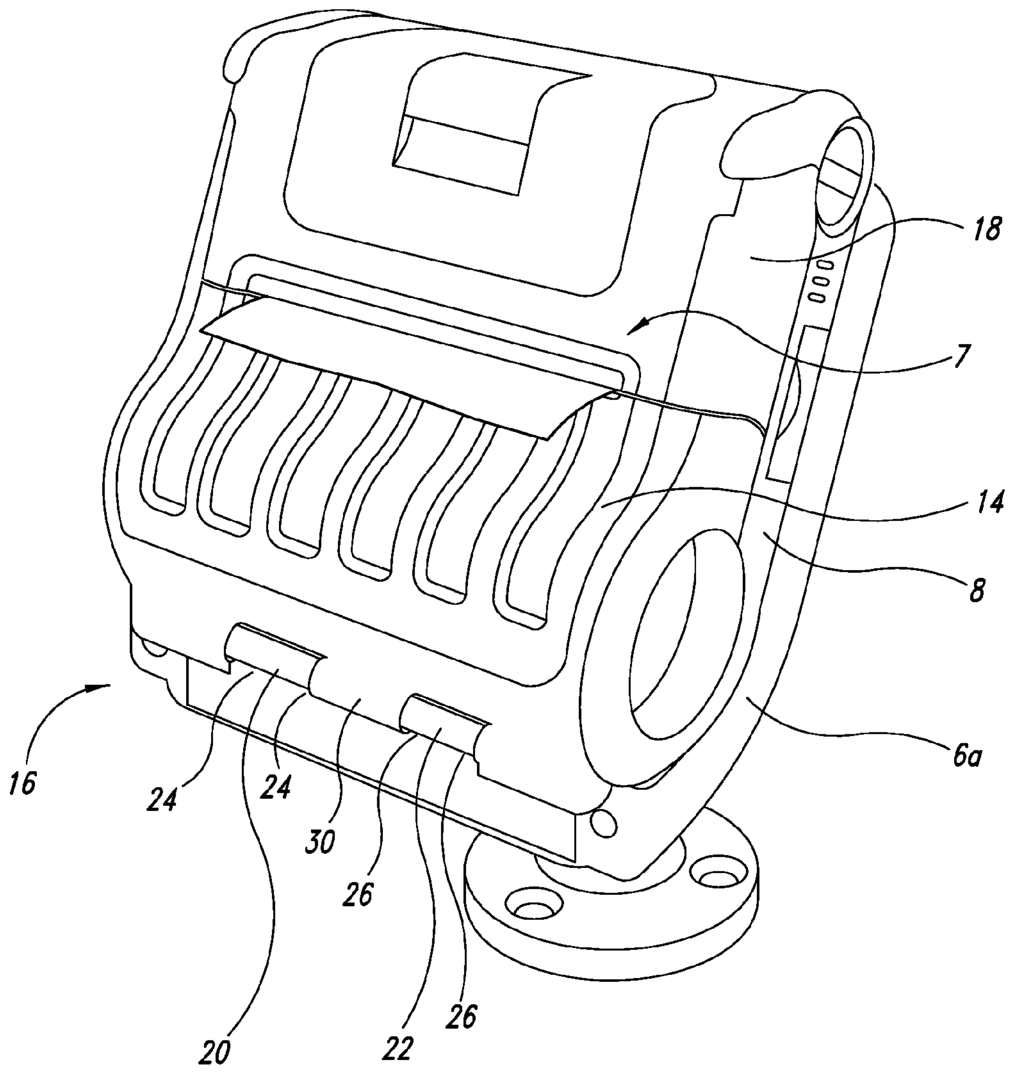
FIG. 3A is a front, top isometric view of a portable electronic system, in the form of a handheld printer and a power supply system, according to another illustrated embodiment.
Figure 3B:
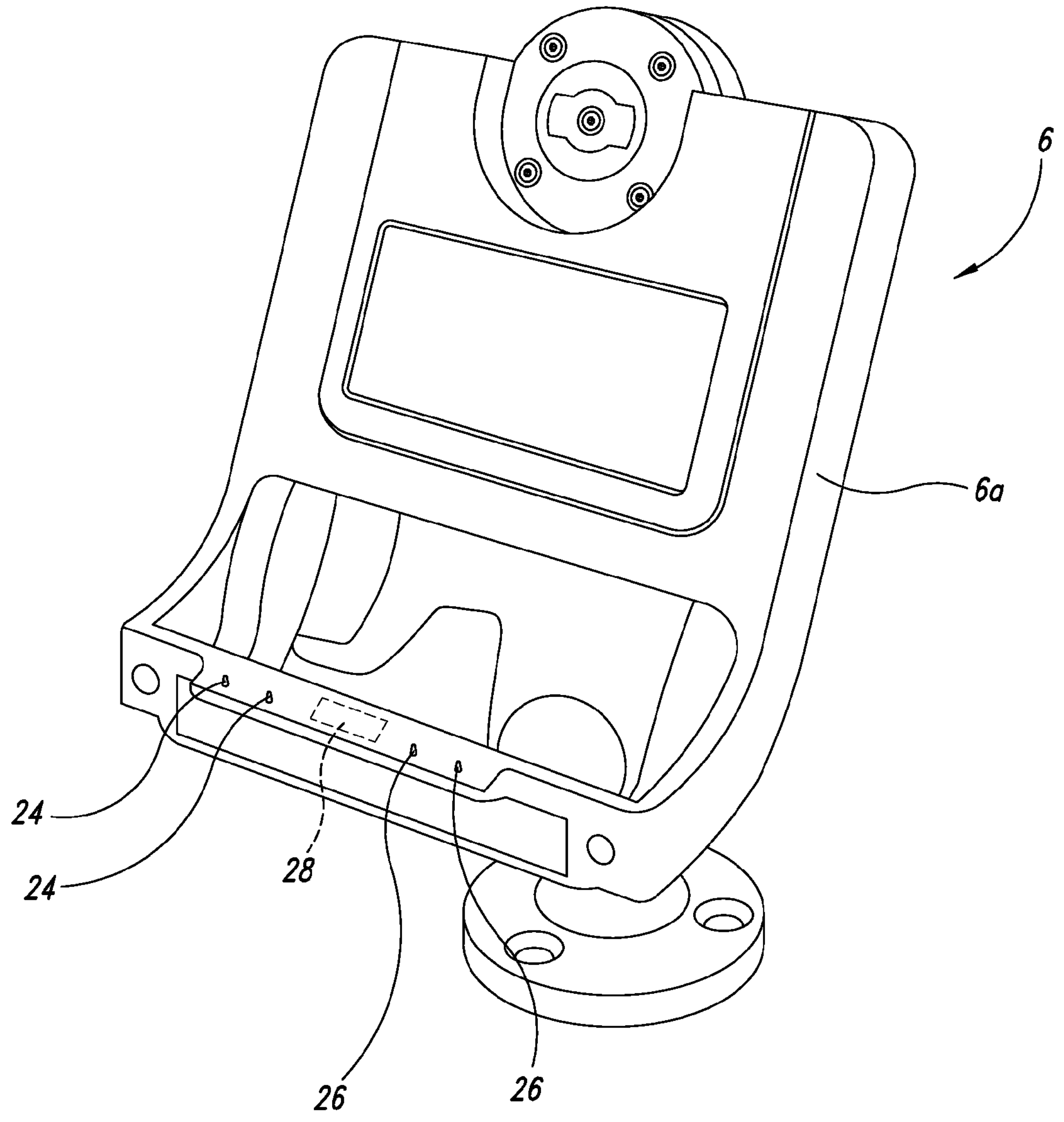
FIG. 3B is a front, top isometric view of a portable electronic system, in the form of a power supply system, according to another illustrated embodiment.

FIGS. 3A and 3B shows an exemplary embodiment of a portable electronic system 2 including an electronic device 4 and an external power supply unit 6. The portable electronic device 4 may include at least one coupling member 16 including at least a first coupling element 20 a second coupling element 22, wherein the first and the second coupling elements take the form of one or more hinges.

The external power supply unit 6 may include a powers supply dock 6*a*; a switch 28 that is a Reed switch and is carried by the external power supply unit 6; and a housing 7 including a magnet 30. The first and the second coupling elements 20, 22 may be electrically coupled to electrical charging contacts 24, 26 of a external power supply unit 6 when the magnet 30 is proximate to the Reed switch. The first and the second coupling elements 20, 22 may be electrically uncoupled from the electrical charging contacts 24, 26 of the external power supply unit 6 when the magnet 30 is not proximate to the Reed switch.

The coupling member 16 may be shaped to mate with the power supply dock 6*a* and provide a secure connection between the coupling member 16 and an external power supply unit 6. In an embodiment, the housing 7 may be shaped to mate with the power supply dock 6*a* and provide a secure connection between the coupling member 16 and the external power supply unit 6. In another embodiment, the housing 7 may be shaped to mate with the power supply dock 6*a* and provide a secure connection between the first and the second coupling elements 20, 22 of the portable electronic device 4, and the at least two electrical charging contacts 24, 26 of the external power supply unit 6.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 60/685,438, filed May 27, 2005, are incorporated herein by reference, in their entirety. Aspects of the invention can be modified, if necessary, to employ systems, circuits, and concepts of the various patents, applications, and publications to provide yet further embodiments of the invention.

While the invention has been described through a discussion of specific embodiments and non-limiting examples thereof, one of ordinary skill in the art may, upon reading the specification and claims, envision other embodiments and variations which are also within the intended spirit and scope of the invention. Accordingly, the scope of the invention shall only be construed and defined by the scope of the appended claims.

What is claimed is:

1. A portable electronic device, comprising:

a first housing member;

a second housing member; and a hinge comprising at least a first hinge element and a second hinge element physically coupling the second housing member to the first housing member, for pivotal movement about a first axis between an opened position that provides access to an interior of the portable electronic device formed between the first and the second housing members from the exterior thereof and a closed position that limits access to the interior of the portable electronic device from the exterior thereof; where at least a portion of each of the first and the second hinge elements is accessible from the exterior of the portable electronic device; and wherein each of the first and the second hinge elements is electrically conductive and provides at least a portion of respective electrical paths from the exterior of the portable electronic device to the interior of the portable electronic device when the first and the second housing members are in the closed position.

2. A portable electronic device, comprising:

a first housing member having an interior and an exterior;

a second housing member; and a hinge physically coupling the second housing member to the first housing member, for pivotal movement about a first axis between an opened position that provides access to the interior of the first housing member from the exterior thereof and a closed position that limits access to the interior of the first housing member from the exterior thereof, the hinge comprising at least a first hinge element and a second hinge element; where at least a portion of each of the first and the second hinge elements is accessible from the exterior of the first housing member; and wherein each of the first and the second hinge elements provides at least a portion of respective electrical paths from the exterior of the first housing member to the interior of the first housing member, wherein the first and the second hinge elements are selectively electrically engageable by a power source externally located with respect to the interior of the first housing member, to provide a current to the interior of the first housing member via the respective electrical paths.

3. The portable electronic device of claim 2, further comprising:

an electrical storage device received in the interior of the first housing member and electrically coupled to the respective electrical paths.

4. The portable electronic device of claim 3, wherein the electrical storage device is at least one rechargeable battery.

5. The portable electronic device of claim 2, further comprising:

a print mechanism received in the interior of the first housing member and electrically coupled to the respective electrical paths.

6. The portable electronic device of claim 2, further comprising:

a print media selectively receivable in the interior of the first housing member when the second housing member is in the opened position.

7. The portable electronic device of claim 2, further comprising:

a magnet carried by the portable electronic device and positioned to actuate a Reed switch associated with the external power source when the first and the second hinge elements are electrically engaged by the external power source.

8. A portable electronic system, comprising:

a housing comprising a first housing member, a second housing member, and at least one coupling member physically coupling the second housing member to the first housing member for movement between an opened position that provides access to an interior of the housing formed by the first and the second housing members from the exterior of the housing and a closed position that limits access to the interior of the housing from the exterior the housing, the at least one coupling member comprising at least a first coupling element and a second coupling element, where at least a portion of each of the first and the second coupling elements is accessible from the exterior of the housing and wherein each of the first and the second coupling elements form at least a portion of a respective electrical path from the exterior of the housing to the interior of the housing; and an external power supply unit having at least two electrical charging contacts for selectively electrically coupling to respective portions of each of the first and the second coupling elements that are accessible from the exterior of the housing, to supply a current to the interior of the housing via the respective electrical paths.

9. The portable electronic system of claim 8, further comprising:

a switch selectively operable to control the supply of current to the interior of the housing via at least one of the respective electrical paths.

10. The portable electronic system of claim 9, wherein the switch is responsive to a position of the housing with respect to the external power supply unit.

11. The portable electronic system of claim 9, wherein the switch is a Reed switch responsive to a position of the housing with respect to the external power supply unit.

12. The portable electronic system of claim 9, wherein the switch is in a closed state to supply current through at least one of the electrical charging contacts of the external power source when the housing is proximate to the external power supply unit and is in an opened state to not supply current through any of the electrical charging contacts when the housing is not proximate to the external power supply unit.

13. The portable electronic system of claim 9, wherein the housing includes a magnet and wherein the switch is a Reed switch carried by the external power supply and is in a closed state to supply current from at least one of the electrical charging contacts of the external power source when the magnet of the housing is proximate to the Reed switch of the external power supply unit and is in an opened state to not supply current from any of the electrical charging contacts when the magnet of the housing is not proximate to the Reed switch of the external power supply unit.

14. The portable electronic system of claim 13, wherein the magnet is proximate to the Reed switch when the first and the second coupling elements are electrically coupled to the electrical charging contacts of the external power supply unit and wherein the magnet is not proximate to the Reed switch when the first and the second coupling elements are electrically uncoupled from the electrical charging contacts of the external power supply unit.

15. The portable electronic system of claim 8, wherein the at least one coupling member comprises at least one hinge physically pivotally coupling the second housing member to the first housing member.

16. The portable electronic system of claim 8, further comprising:

a rechargeable electrical energy storage device internally housed in the housing and electrically coupled to the respective electrical paths.

17. The portable electronic system of claim 8, further comprising:

a print mechanism received in the interior of the first housing member and electrically coupled to the respective electrical paths; and a print media selectively receivable in the interior of the housing when the second housing member is in the opened position.

18. The portable electronic device of claim 2 wherein the portions of the first and the second hinge elements are accessible from the exterior of the first housing member when the first and the second housing members are in the closed position.

19. The portable electronic system of claim 8 wherein the portions of the first and the second coupling elements are accessible from the exterior of the first housing member when the first and the second housing members are in the closed position.

* * * * *

UNITED STATES PATENT AND TRADEMARK OFFICE

CERTIFICATE OF CORRECTION

PATENT NO. : 7,578,628 B2
APPLICATION NO. : 11/420685
DATED : August 25, 2009
INVENTOR(S) : Sherman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 432 days.

Signed and Sealed this

Seventh Day of September, 2010

David J. Kappos

*Director of the United States Patent and Trademark Office*